(12) United States Patent
Wikstrand

(10) Patent No.: US 10,587,149 B2
(45) Date of Patent: *Mar. 10, 2020

(54) TESTING DEVICE FOR WIRELESS POWER TRANSFER, AND ASSOCIATED METHOD

(71) Applicant: NOK9 ip AB, Malmo (SE)

(72) Inventor: Magnus Wikstrand, Limhamn (SE)

(73) Assignee: nok9 AB, Malmo (SE)

( * ) Notice: Subject to any disclaimer, the term of this patent is extended or adjusted under 35 U.S.C. 154(b) by 0 days.

This patent is subject to a terminal disclaimer.

(21) Appl. No.: 16/114,804

(22) Filed: Aug. 28, 2018

(65) Prior Publication Data

US 2018/0366990 A1 Dec. 20, 2018

Related U.S. Application Data

(63) Continuation of application No. 15/169,089, filed on May 31, 2016, now Pat. No. 10,079,511.

(30) Foreign Application Priority Data

Jun. 8, 2015 (SE) ........................................ 1550754

(51) Int. Cl.
*H02J 50/12* (2016.01)
*G01R 31/40* (2020.01)
*H02J 50/80* (2016.01)
*H02J 7/02* (2016.01)
*G01R 31/42* (2006.01)

(52) U.S. Cl.
CPC .............. *H02J 50/12* (2016.02); *G01R 31/40* (2013.01); *G01R 31/42* (2013.01); *H02J 7/025* (2013.01); *H02J 50/80* (2016.02)

(58) Field of Classification Search
CPC . H02J 50/12; H02J 7/025; H02J 50/80; G01R 31/42; G01R 31/40
See application file for complete search history.

(56) References Cited

U.S. PATENT DOCUMENTS

| 6,094,609 | A | 7/2000 | Arjomand | |
| 9,479,013 | B2 * | 10/2016 | Joye | H02J 5/005 |
| 9,496,755 | B2 * | 11/2016 | Low | H02J 17/00 |
| 9,503,178 | B2 * | 11/2016 | Lee | H02J 17/00 |
| 10,079,511 | B2 * | 9/2018 | Wikstrand | G01R 31/42 |
| 2008/0211455 | A1 | 9/2008 | Park et al. | |
| 2013/0127254 | A1 | 5/2013 | Miichi et al. | |
| 2013/0181816 | A1 | 7/2013 | Carlson, Jr. et al. | |

(Continued)

OTHER PUBLICATIONS

Extended European Search Report issued by the European Patent Office for European Patent Application No. 16171955.4, dated Oct. 17, 2016 (6 pages).

*Primary Examiner* — Christopher P McAndrew
*Assistant Examiner* — Zannatul Ferdous
(74) *Attorney, Agent, or Firm* — Honigman LLP; Anna M. Budde

(57) ABSTRACT

A testing device for use in testing of wireless power transfer is disclosed. The testing device has a housing, a wireless power receiver coil provided in the housing, and a cable extending from the housing at a first end and having a cable connector at a second end. The cable accommodates connection wiring of the wireless power receiver coil. The cable connector comprises a data storage configured to contain characteristic information about the wireless power receiver coil.

13 Claims, 5 Drawing Sheets

(56) References Cited

U.S. PATENT DOCUMENTS

2014/0191568 A1   7/2014   Partovi
2014/0312880 A1   10/2014  Radermacher et al.
2015/0015180 A1   1/2015   Miller et al.
2015/0035374 A1   2/2015   Park et al.
2016/0233711 A1   8/2016   Miller et al.

* cited by examiner

TESTING DEVICE FOR WIRELESS POWER TRANSFER, AND ASSOCIATED METHOD

CROSS-REFERENCE TO RELATED APPLICATION

The present patent application is a continuation of U.S. patent application Ser. No. 15/169,089, filed on May 31, 2016, which claims Paris convention priority to Swedish Patent Application 1550754-4, filed on Jun. 8, 2015, the contents of each of which are incorporated herein in their entirety by reference.

TECHNICAL FIELD

The present invention generally relates to the field of wireless power transfer, and more specifically to testing of wireless power transfer. Even more specifically, the present invention relates to a testing device for use in testing of wireless power transfer, the testing device having a wireless power receiver coil. The present invention also relates to a method of testing wireless power transfer from a wireless power transmitter device having a wireless power transmitter coil.

BACKGROUND

Wireless power transfer is expected to become increasingly popular, for instance for wireless battery charging of mobile devices such as, for instance, mobile terminals, tablet computers, laptop computers, cameras, audio players, rechargeable toothbrushes, wireless headsets, as well as various other consumer products and appliances.

The Wireless Power Consortium has developed a wireless power transfer standard known as Qi. Other known wireless power transfer approaches include Alliance for Wireless Power, and Power Matters Alliance.

The wireless power transfer standard known as Qi by the Wireless Power Consortium will be referred to, without limitation, throughout this document as the presently preferred wireless power transfer manner applicable to the present invention. However, the invention may generally be applied also to other wireless power transfer standards or approaches, including but not limited to the ones mentioned above. Also, this disclosure is not limited to any particular power range but includes, without limitation, low power applications as well as medium power applications and high power applications.

Operation of devices that comply with Qi relies on magnetic induction between planar coils. Two kinds of devices are involved, namely devices that provide wireless power (referred to as base stations), and devices that consume wireless power (referred to as mobile devices). Power transfer takes place from a base station to a mobile device. For this purpose, a base station contains a subsystem (a power transmitter) that comprises a primary coil, whereas a mobile device contains a subsystem (a power receiver) that comprises a secondary coil. In operation, the primary coil and the secondary coil will constitute the two halves of a coreless resonant transformer.

Typically, a base station has a flat surface, on top of which a user can place one or more mobile devices so as to enjoy wireless battery charging or operational power supply for the mobile device(s) placed on the base station.

As with most electric power applications, there is a need to test the devices involved in wireless power transfer. There are several reasons why testing is important; regulatory requirements, manufacturer liability and market competition are a few examples.

In wireless power transfer, there is a desire to measure the energy received by the mobile device in order to assess the capability of the wireless power transmitter device 20 to deliver wireless power according to a given rating, criterion or standard, and/or to verify compliance with an applicable wireless power transfer standard.

Also, it is desired to test the communication between the transmitter (base station) and receiver (mobile device). In, for instance, Qi Medium Power, the wireless power transfer is controlled by way of complex handshaking and signaling between the devices, i.e. a bidirectional communication between the devices. In, for instance, Qi Low Power, there is a unidirectional communication where the receiver (mobile device) sends control messages to the transmitter (base station).

Moreover, there is a desire to evaluate the thermal exposure of a mobile device when being subjected to wireless power transfer from a wireless power transmitter. This is because during operation, heat will be generated by magnetic induction in the secondary coil of the power receiver, i.e. in the mobile device. Also, the power transmitter in the base station will generate heat that will be conveyed from the base station to the mobile device. If the thermal exposure for the mobile device becomes excessive, several undesired effects may arise. For instance, vital components may be damaged in the mobile device, such as for instance a lithium ion battery or electronic circuitry in a smartphone. At severe overheating, objects in the vicinity of the mobile device may be damaged and even cause a fire or toxic smoke hazard. Furthermore, the duration of the charging period may be prolonged, since protective circuitry in the mobile device may intervene to reduce or even suspend the charging power until the temperature has been reduced again.

Base stations can be tested by the provision of respective testing devices which comprise a wireless power receiver coil that matches the wireless power transmitter coil of the base station to be tested. By placing such a testing device on or otherwise adjacent to the base station and connecting the testing device to a host device, the host device may run various wireless power transfer tests by driving the wireless power receiver coil in a manner which mimics the indented operation of a mobile device from the base station's perspective, By monitoring the resulting behavior of the testing device, the host device may evaluate the performance of the base station and also identify potentially abnormal behavior of the base station. Since there are several different types of wireless power coils on the market, several different types of testing devices may also be required.

However, to perform these tests accurately, the host device needs to know certain information about the wireless power receiver coil. Such information can be hard-coded into the test session program run by the host device, or retrieved from a settings file or database at runtime. Alternatively, it may be entered manually by a test operator before or during the execution of the test session program.

The present inventor has identified problems and shortcomings with these approaches, since they are potentially error-prone and complicated. Relevant information about the wireless power receiver coil may be missing or incorrect. Manual approaches may be subject to errors in data entry. Also, there is a risk of mixing up different instances of testing devices, such that a test operator may intend to connect a certain testing device (having a certain specific type of wireless power receiver coil) in order to run tests on that receiver coil, but inadvertently connects another testing device (having another specific type of wireless power receiver coil) to the host device. The outcome of the test session will therefore be unreliable, misleading or even dangerous.

Hence, there is an expected need among different interest groups to be able to perform improved tests of wireless power transfer, taking the problems and shortcomings listed above into account. Such interest groups may for instance involve any of the following: developers, manufacturers or suppliers of wireless power transmitter devices; test or compliance entities in the field of wireless power transfer; and test or compliance entities in the field of consumer product safety.

SUMMARY OF THE DISCLOSURE

It is accordingly an object of the present invention to offer improvements in the technical field of wireless power transfer.

A first aspect of the present invention is a testing device for use in testing of wireless power transfer. The testing device comprises a housing, a wireless power receiver coil provided in the housing, and a cable extending from the housing at a first end and having a cable connector at a second end. The cable accommodates connection wiring of the wireless power receiver coil. The cable connector comprises a data storage, such as an electronic memory, configured to contain characteristic information about the wireless power receiver coil.

Advantageously, the characteristic information about the wireless power receiver coil comprises a type or class of the wireless power receiver coil.

Also, the characteristic information about the wireless power receiver coil may advantageously further comprise one or more of the following: a unique identifier of the wireless power receiver coil; an inductance value of the wireless power receiver coil; a first resonance frequency of the wireless power receiver coil, the first resonance frequency being an operation resonance frequency for wireless power transfer; a second resonance frequency of the wireless power receiver coil, the second resonance frequency being a detection resonance frequency for wireless power transfer; a first equivalent series resistance, ESR, value for the wireless power receiver coil at a first frequency; a second equivalent series resistance, ESR, value for the wireless power receiver coil at a second frequency; a first Q value for the wireless power receiver coil at the first frequency; and a second Q value for the wireless power receiver coil at the second frequency.

In a preferred embodiment, the cable connector has a connector housing and a printed circuit board confined within the connector housing, wherein the data storage is mounted on the printed circuit board.

Also, the cable connector may advantageously comprise a plurality of connector terminals, wherein the data storage is connected to at least one of the connector terminals, and wherein the characteristic information about the wireless power receiver coil is readable by a host device for testing of wireless power transfer.

The testing device may further comprise a sensor for detecting an operation condition of the testing device, wherein an output of the sensor is connected to at least one of the connector terminals and is readable by the host device for testing of wireless power transfer.

Additionally or alternatively, the testing device may further comprise a status indicator for indicating a status of the testing device, wherein an input of the status indicator is connected to at least one of the connector terminals and is drivable by the host device for testing of wireless power transfer.

In one advantageous embodiment, the printed circuit board further comprises tuning circuitry for the wireless power receiver coil. Such tuning circuitry may comprise a first capacitor for tuning of an operation resonance frequency for wireless power transfer, and a second capacitor for tuning of a detection resonance frequency for wireless power transfer.

Advantageously, the characteristic information about the wireless power receiver coil may further comprise respective capacitance values of such first and second capacitors.

In one embodiment, the housing has a lower housing part with a bottom side adapted for placement on a surface of a wireless power transmitter device having a wireless power transmitter coil, and an upper housing part.

The testing device may advantageously be adapted for use with the wireless power transmitter device in the form of a wireless charger.

A second aspect of the present invention is a method of testing wireless power transfer from a wireless power transmitter device having a wireless power transmitter coil. The method involves:

providing a testing device having a housing, a wireless power receiver coil provided therein, and a cable extending from the housing at a first end and having a cable connector at a second end, the cable accommodating connection wiring of the wireless power receiver coil;

providing a host device, the host device comprising a processing means and one or a plurality of cable connector inputs;

placing the testing device on, at or near the wireless power transmitter device;

connecting the cable connector of the cable of the testing device to one of said one or a plurality of cable connector inputs;

reading, by the processing means, data from a data storage of the testing device, wherein the data comprises characteristic information about the wireless power receiver coil in the testing device; and controlling, by the processing means and based on the characteristic information about the wireless power receiver coil, a session for testing wireless power transfer which involves the wireless power transmitter device and the testing device.

In one or more embodiments, controlling a session for testing wireless power transfer comprises:

checking the characteristic information to verify at least one parameter of the wireless power receiver coil; and initiating the session for testing wireless power transfer only upon successful verification of the parameter of the wireless power receiver coil.

Advantageously, providing a testing device involves providing the testing device as defined for the first aspect of the invention.

Embodiments of the invention are defined by the appended dependent claims and are further explained in the detailed description section as well as on the drawings.

It should be emphasized that the term "comprises/comprising" when used in this specification is taken to specify the presence of stated features, integers, steps, or components, but does not preclude the presence or addition of one or more other features, integers, steps, components, or groups thereof. All terms used in the claims are to be interpreted according to their ordinary meaning in the technical field, unless explicitly defined otherwise herein. All references to "a/an/the [element, device, component, means, step, etc]" are to be interpreted openly as referring to at least one instance of the element, device, component, means, step, etc., unless explicitly stated otherwise. The steps of any method disclosed herein do not have to be performed in the exact order disclosed, unless explicitly stated.

Directions and orientations is three-dimensional space for the testing device as described herein are generally expressed with respect to a horizontal orientation for the testing device, corresponding to the testing device lying on a horizontal surface.

BRIEF DESCRIPTION OF THE DRAWINGS

Objects, features and advantages of embodiments of the invention will appear from the following detailed description, reference being made to the accompanying drawings.

DETAILED DESCRIPTION

Figure 1:
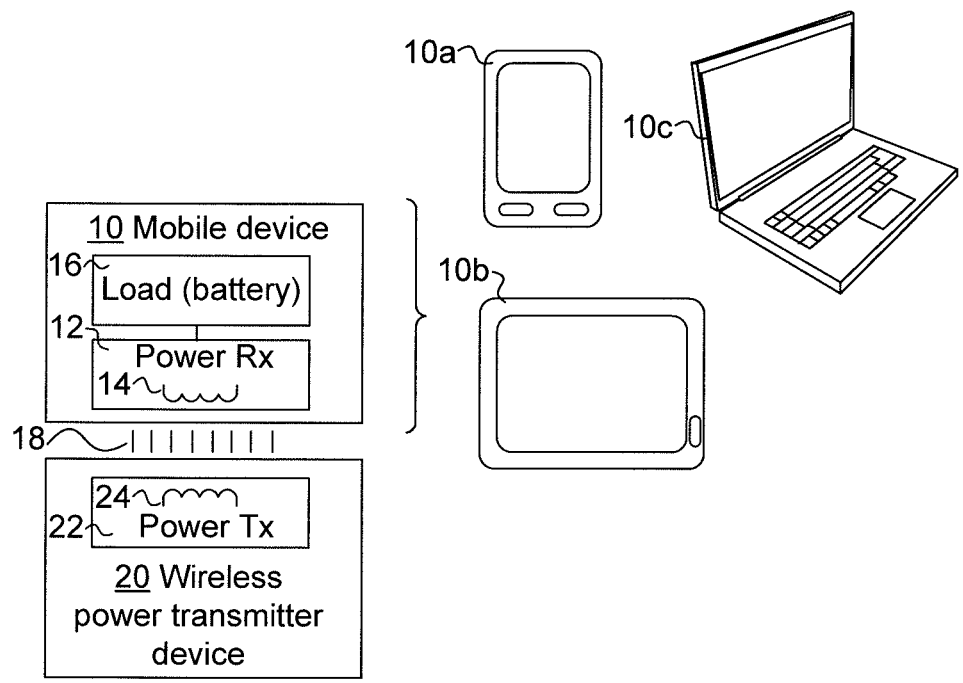
FIG. 1 is a schematic block diagram of a wireless power transmitter device for wireless power transfer to a mobile device.

Embodiments of the invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular embodiments illustrated in the accompanying drawings is not intended to be limiting of the invention. In the drawings, like numbers refer to like elements.

FIG. 1 illustrates a wireless power transmitter device 20 for wireless power transfer to a mobile device 10. The mobile device may, for instance, be a mobile terminal (e.g. smartphone) 10a, tablet computer 10b (e.g. surfpad), laptop computer 10c, camera, audio player, rechargeable toothbrush, wireless headset, or another kind of consumer product or appliance.

The wireless power transfer will be described as being compliant with the Qi standard by the Wireless Power Consortium; hence, the wireless power transmitter device 20 is a base station in the Qi terminology. However, as already mentioned, the invention is generally applicable also to other wireless power transfer standards or approaches, including but not limited to the ones mentioned in the Background section.

The wireless power transmitter device 20 comprises a wireless power transmitter 22 having a wireless power transmitter coil 24. Correspondingly, the mobile device 10 comprises a wireless power receiver 12 having a wireless power receiver coil 14. In operation, the wireless power transmitter device 20 will transfer power wirelessly to the mobile device 10 by way of magnetic induction 18 via the wireless power transmitter coil 24 and wireless power receiver coil 14.

The power received by the wireless power receiver coil 14 will drive a load 16 in the mobile device 10. Typically, the load 16 may be a rechargeable battery, such as a lithium ion battery; hence, the wireless power transmitter device 20 will act as a wireless power charger for the mobile device 10. In another scenario, the load 16 may be electronic circuitry in the mobile device, wherein the wireless power transmitter device 20 will act as a wireless power supply for the mobile device 10.

As explained in the Background section, it is desired to be able to test the performance of the wireless power transmitter device 20 with respect to its intended use with mobile devices, such as mobile device 10.

Figure 8:
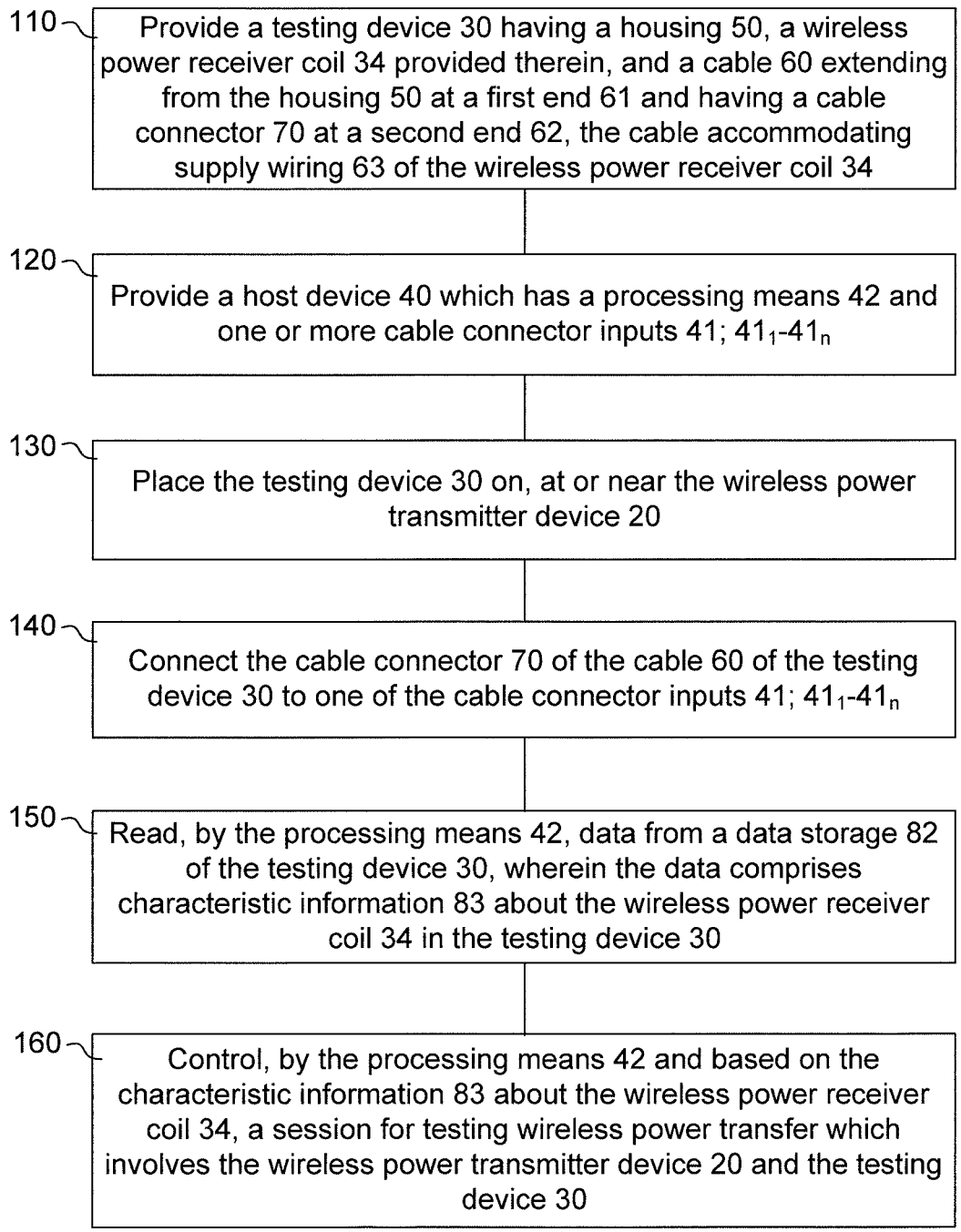
FIG. 8 is a flowchart diagram of a method of testing wireless power transfer from a wireless power transmitter device having a wireless power transmitter coil, involving use of a testing device as referred to above.

To this end, a testing device 30 has been provided, embodiments of which are illustrated in FIGS. 2-5. There is also provided an associated method of testing wireless power transfer from a wireless power transmitter device having a wireless power transmitter coil. This method is illustrated in FIG. 8.

Figure 2:
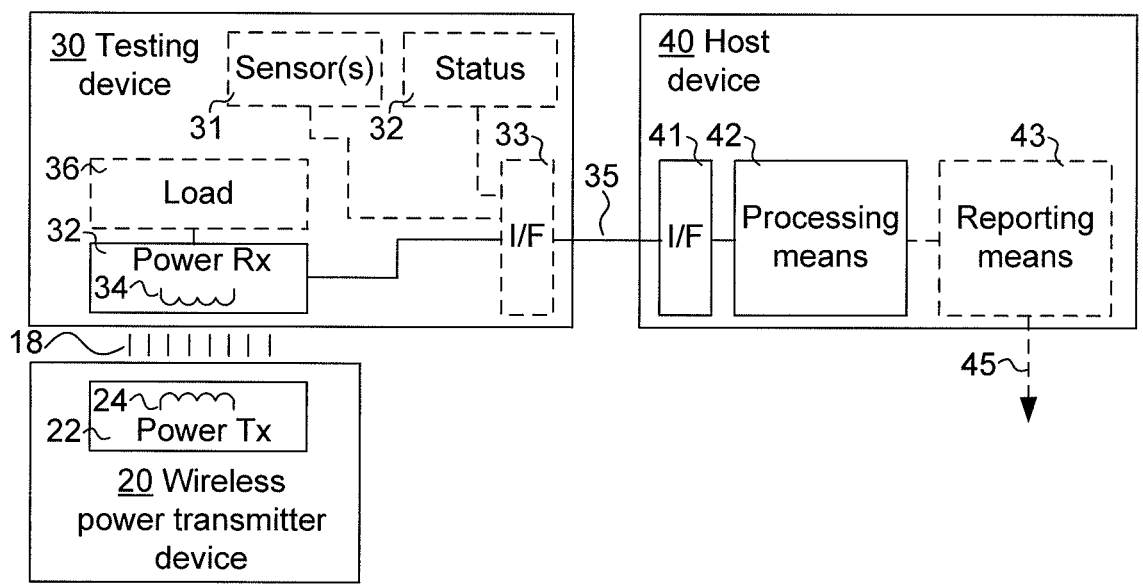
FIG. 2 is a schematic block diagram of a setup for testing of wireless power transfer, including a testing device, a wireless power transmitter device and a host device.

FIG. 2 is a schematic block diagram which shows a testing device 30 for use with a wireless power transmitter device 20 under the control of a host device 40. The wireless power transmitter device 20 has a wireless power transmitter 22 and a wireless power transmitter coil 24, and may be identical to the wireless power transmitter device 20 in FIG. 1. As will be described in more detail below, the testing device 30 has a wireless power receiver 32 with a wireless power receiver coil 34 which matches the wireless power transmitter coil 24 of the wireless power transmitter 22. A suitable load 36 may be provided to handle excess power received by the wireless power receiver coil 34 in the testing device 30. For instance, a suitably dimensioned resistor may be used.

Figure 6:
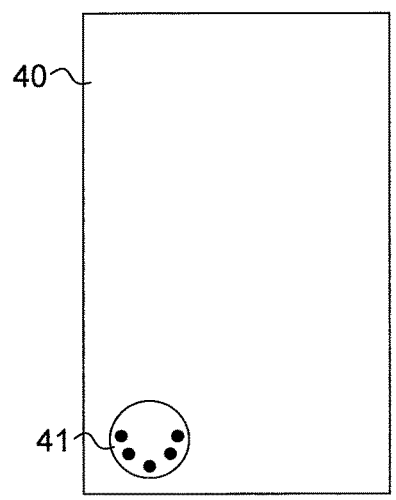
FIG. 6 is a schematic side view of the host device in one embodiment, having a single cable connector input for a testing device as referred to above.
Figure 7:
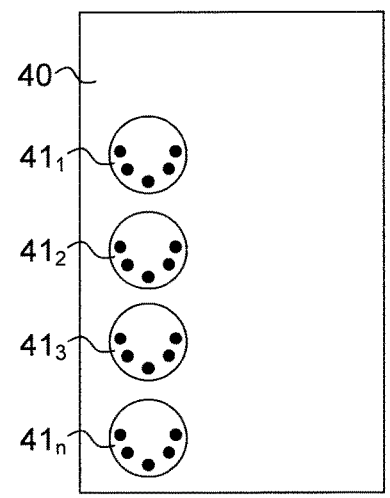
FIG. 7 is a schematic side view of the host device in another embodiment, having a plurality of cable connector inputs for concurrent connection of several testing devices as referred to above.

The testing device 30 is connected to the host device 40 via a link 35. Schematic side views of different embodiments of the host device 40 are seen in FIGS. 6 and 7. In the disclosed embodiments, the link 35 includes a cable 60 which will be described in more detail later. In operation during a test session, the wireless power transmitter device 20 will transfer power wirelessly to the testing device 30 by way of magnetic induction 18 via the wireless power transmitter coil 24 and the wireless power receiver coil 34.

The testing device 30 may optionally have one or more sensors 31 for detecting an operation condition of the testing device 30 during the test session. Measurement data from the sensor(s) 31 may be provided via an interface 33 in the testing device 30 to the host device 40 via an interface 41, as is seen in FIG. 2. For instance, the sensor(s) 31 may be thermo sensory means capable of measuring the thermal exposure of the testing device 30 caused by the wireless power transfer from the wireless power transmitter device 20. Suitable thermo sensory means are disclosed in detail in Swedish patent applications 1451306-3 and 1550340-2, the contents of which are incorporated herein by reference in their entirety.

The testing device 30 may optionally have one or more status indicators 32 for indicating a status of the testing device during the test session. The status indicator(s) 32 may be drivable by the host device 40 via the aforementioned interfaces 33, 41. Examples of status indicators include light emitting diodes, lamps, displays, buzzers, speakers and vibrators.

The host device 40 also has processing means 42 for measuring/analyzing the received power by the testing device 30 over the link 35, and processing any measurement data received from the testing device 30 if applicable. The processing means 42 may comprise a programmable device, such as a microcontroller, central processing unit (CPU), digital signal processor (DSP) or field-programmable gate array (FPGA) with appropriate software and/or firmware, and/or dedicated hardware such as an application-specific integrated circuit (ASIC).

Furthermore, the host device 40 may have reporting means 43 for communicating or presenting results obtained by the processing means 42. This may involve presentation of graphical information on a local user interface (e.g. display) of the host device 40, generating of visual and/or audible alarms, or communication of information to an external device, as seen at 45 in FIG. 2.

Embodiments of the testing device 30 will now be described with reference to FIGS. 3-5. Other embodiments than the illustrated ones are of course possible within the scope of the invention.

Figure 3:
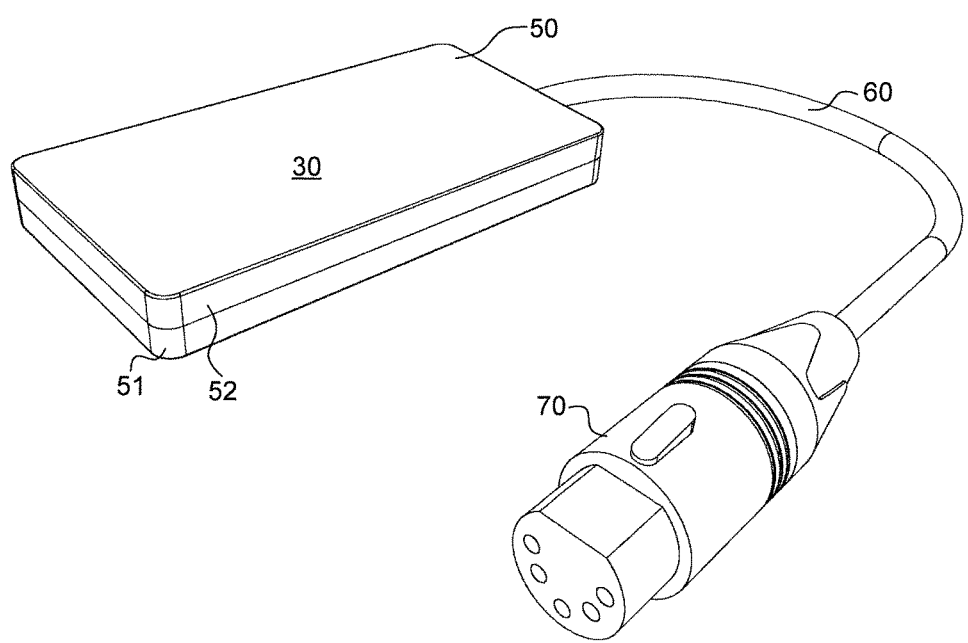
FIG. 3 is an isometric view of the testing device according to one embodiment, seen in an assembled state, the testing device having a cable with a cable connector for connection to the host device.

As seen particularly in FIG. 3, the testing device 30 in the disclosed embodiment essentially has the shape of a thin box with rounded edges and corners. The testing device 30 has a housing 50 having a lower housing part 51 and an upper housing part 52. The lower housing part 51 has a bottom side adapted for placement on a surface of the wireless power transmitter device 20. The upper housing part 52 has a top side opposite to the bottom side. The lower housing part 51 may be made of plastic or another material suitable for admitting the inductive coupling 18 between the wireless power transmitter coil 24 of the wireless power transmitter device 20 and the wireless power receiver coil 34 of the wireless power receiver 32. The upper housing part 52 may also be made of plastic, or alternatively of a material, such as aluminium or glass, having heat dissipation properties similar to a typical mobile device that the wireless power transmitter device 20 is designed for use with.

In the disclosed embodiment of FIG. 3, the testing device 30 has a cable 60 which constitutes or at least forms a part of the link 35 to the host device 40, as referred to above for FIG. 2. The cable 60 has a cable connector 70 which is connectable to the host device 40.

Figure 4:
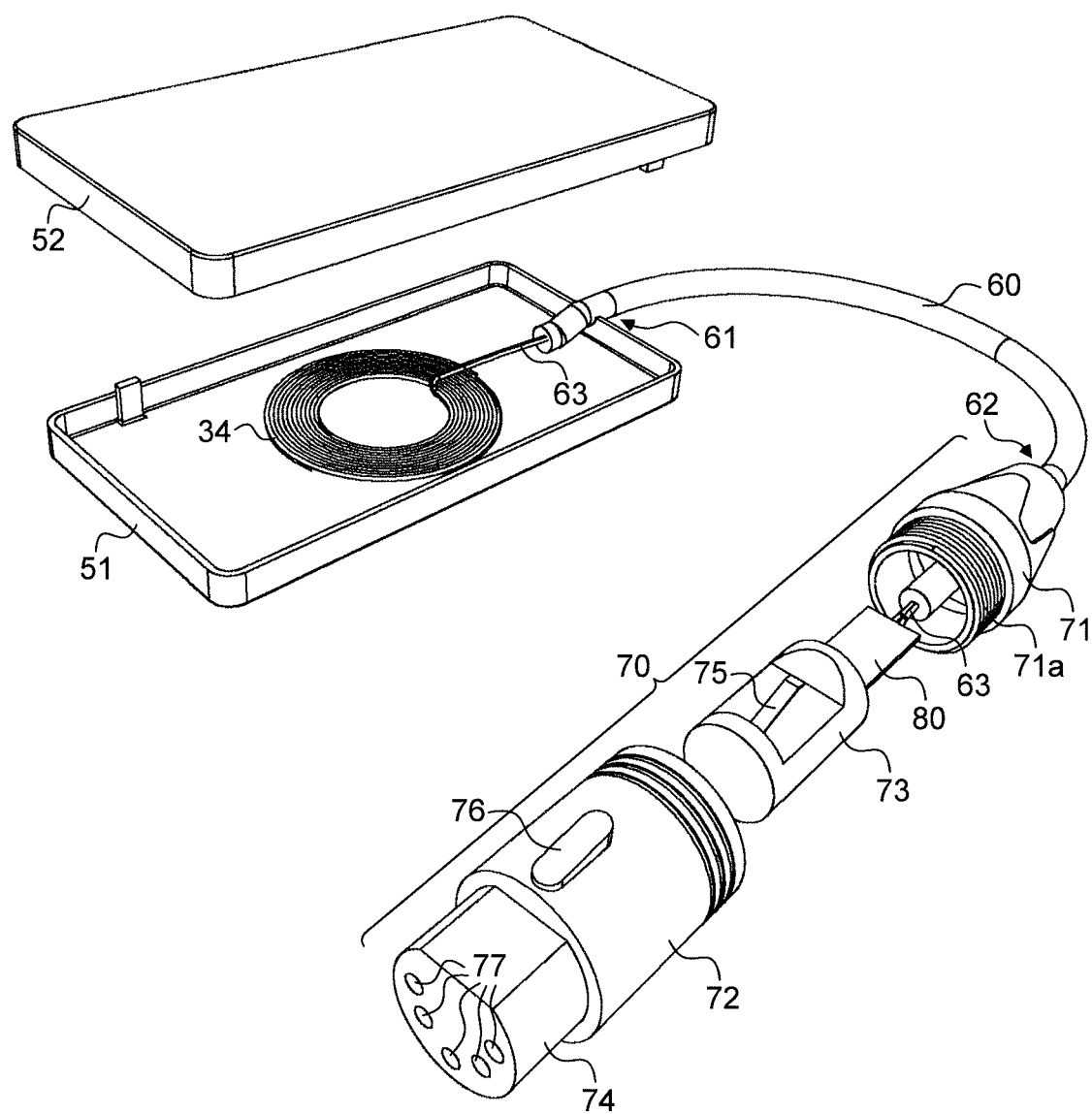
FIG. 4 is an isometric view of the testing device of FIG. 3, now seen in a disassembled state.

Reference is now made to the exploded isometric views in FIG. 4, illustrating the disclosed embodiment of the testing device 30 in a disassembled state. The wireless power receiver coil 34 is provided inside the housing 50. As explained above, the testing device 30 may optionally include one or more sensors 31, one or more status indicators 30, and the interface 35. None of these optional elements are shown in FIG. 4 for reasons of brevity.

As seen in FIG. 4, the cable 60 extends from the housing 50 at a first end 61. The cable connector 70 is at an opposite second end 62 of the cable 60. The cable 60 accommodates connection wiring 63 of the wireless power receiver coil 34.

In the disclosed embodiment, the connection wiring 63 is the same physical wiring as makes up the loops of the wireless power receiver coil 34; the ends of the coil 34 thus continue uninterrupted through the cable 60 to the cable connector 70. This arrangement is believed to be advantageous, since a signal junction between the loops of the coil 34 and the start of the cable 60 (at the first end 61) has been avoided. In other embodiments, however, it may be possible to have a separate connection wiring 63 which connects to the loops of the coil 34 somewhere at the first end 61.

The cable connector 70 has a connector housing comprising a rear part 71 and a front part 72. The front part 72 can be threaded onto the rear part 71 thanks to a threading 71a on the rear part 71 and a matching threading inside the front part 72.

The front part 72 has a protruding plug 74 which serves for mating with a corresponding recess in a socket on the host device 40. The protruding plug 74 has a plurality of cable connector terminals 77 at the front side of the plug 74.

Inside the cable connector 70 there is an insert member 73 having a resilient element 75 which is actuatable by pushing on a button 76 on the outside of the front part 72. The elements 75 and 76 serve to provide a secure engagement when the cable connector 70 is inserted in a corresponding input or socket on the host device 40 (see sockets 41 and $41_1$-$41_n$ in FIG. 6 and FIG. 7, respectively).

In the disclosed embodiment, the cable connector 70 is a five-terminal female XLR connector. However, other types of connectors are equally possible, both in terms of the type of cable connector, and the number and "gender" (male/female) of the cable connector terminals 77.

As seen in FIG. 4, a printed circuit board 80 is confined within the connector housing 71, 72. A schematic circuit diagram of the printed circuit board 80 within the cable connector 70, with a data storage 82 mounted thereon, is shown in FIG. 5.

The data storage 82 is configured to contain characteristic information 83 about the wireless power receiver coil 34. In the disclosed embodiment, the data storage 82 is an electronic memory, or more specifically an EEPROM memory, such as for instance the integrated circuit DS24B33+ by Maxim Integrated, 160 Rio Robles, San Jose, Calif. 95134, USA. Various other types of electronic memories or other data storages may also be used, as is readily realized by a skilled person.

Figure 5:
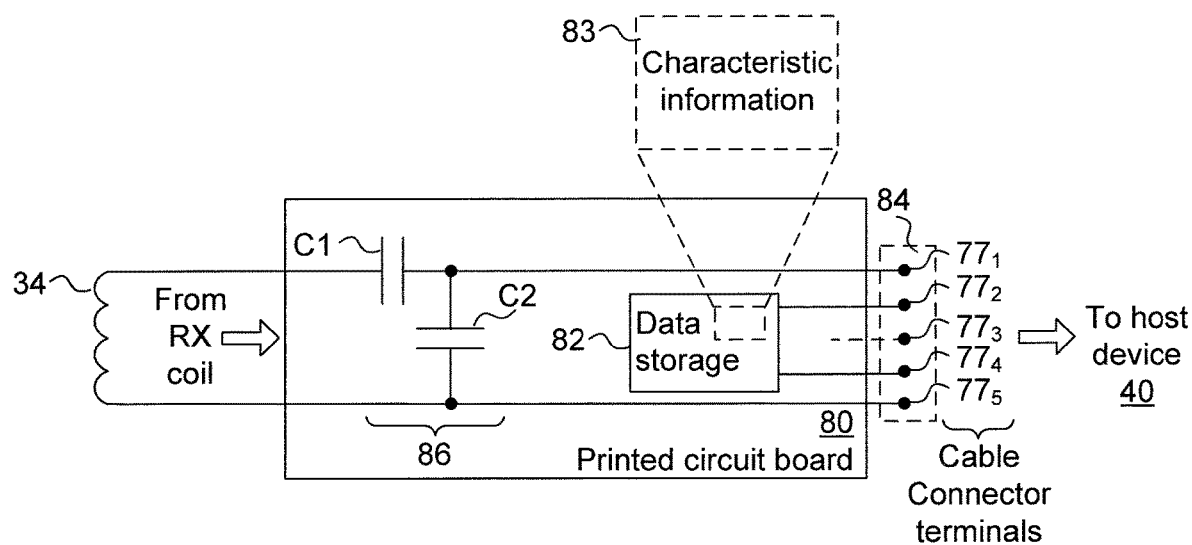
FIG. 5 is a schematic circuit diagram of a printed circuit board within the cable connector, the printed circuit board comprising a data storage configured to contain characteristic information about a wireless power receiver coil of the testing device.

The data storage 82 is connected to at least one of the connector terminals 77 of the cable connector 70, as is seen at 84 in FIG. 5. In the disclosed embodiment of FIG. 5, the data storage 82 is connected to the connector terminals $77_2$, $77_4$, where terminal $77_2$ may be a terminal for data reading & voltage supply to the data storage 82, and terminal $77_4$ may be a terminal for ground. The characteristic information 83 about the wireless power receiver coil 34, as stored in the data storage 82, is therefore readable by the host device 40 for testing of wireless power transfer.

In embodiments where the testing device 30 includes as sensor 31 for detecting an operation condition of the testing device, an output of the sensor 31 may be connected to at least one of the connector terminals 77, such as for instance connector terminals $77_3$, $77_4$, to render it readable by the host device 40 for testing of wireless power transfer.

Likewise, in embodiments where the testing device 30 includes a status indicator 32 for indicating a status of the testing device 30, an input of the status indicator 32 may be connected to at least one of the connector terminals 77, such as for instance connector terminals $77_3$, $77_4$, to render it controllable by the host device 40 for testing of wireless power transfer.

If need be, the number of connector terminals 77 may be increased in order to make them available for such sensor(s) 31 and/or status indicator(s) 32. Alternatively, the communication between the host device 40 and any or all of these optional elements may occur over a separate link (wired or wireless).

The characteristic information 83 about the wireless power receiver coil 34 advantageously comprises a type or class of the wireless power receiver coil 34. For instance, when the wireless power receiver coil 34 is a Qi low power coil, its type or class may be indicated in the characteristic information 83 as a value A, B, C, D, . . . .

As will appear in more detail later with reference to the forthcoming description of the testing method illustrated in FIG. 8, the indication of the actual coil type of the wireless power receiver coil 34 in the characteristic information 83 will allow for the host device 40 to detect an error situation when a test operator inadvertently is about to start a test session for another instance of the test device 30 (i.e., based upon another coil type), than what was intended.

Advantageously, the characteristic information 83 about the wireless power receiver coil 34 also comprises the following additional data, or parts thereof:

A unique identifier of the wireless power receiver coil 34. The unique identifier may, for instance, be given as a serial number.

An inductance value of the wireless power receiver coil 34, expressed as a numerical value in H (or magnitudes thereof).

A first resonance frequency of the wireless power receiver coil 34, expressed as a numerical value in Hz (or magnitudes thereof). The first resonance frequency will typically be an operation resonance frequency for wireless power transfer. For instance, for Qi low power applications, the first resonance frequency may be at about 100 kHz.

A second resonance frequency of the wireless power receiver coil 34, expressed as a numerical value in Hz (or magnitudes thereof). The second resonance frequency will typically be a detection resonance frequency for wireless power transfer. For Qi low power applications, the second resonance frequency may be at about 1 MHz.

A first equivalent series resistance, ESR, value for the wireless power receiver coil 34 at a first frequency, which may be aforesaid first resonance frequency. The first ESR value may be expressed as a numerical value in Ω (or magnitudes thereof).

A second equivalent series resistance, ESR, value for the wireless power receiver coil 34 at a second frequency, which may be different from aforesaid first resonance frequency. The second ESR value may be expressed as a numerical value in Ω (or magnitudes thereof).

A first Q value for the wireless power receiver coil 34 at the first frequency.

A second Q value for the wireless power receiver coil 34 at the second frequency.

As will appear in more detail later with reference to the forthcoming description of the testing method illustrated in FIG. 8, including any or all of the additional data in the characteristic information 83 will allow for the host device 40 to perform an accurate test session, being based on exact respective parameter values of the individual wireless power receiver coil 34. Also, it will allow for the host device 40 to perform compliance tests with respect to an applicable wireless power transfer standard, such as Qi.

In an advantageous embodiment, as is shown in FIG. 5, the printed circuit board 80 inside the cable connector 70 further comprises tuning circuitry 86 for the wireless power receiver coil 34. Hence, the tuning circuitry 86 may comprise a first capacitor C1 for tuning of an operation resonance frequency for wireless power transfer, and a second capacitor C2 for tuning of a detection resonance frequency for wireless power transfer. In this advantageous embodiment, the characteristic information 83 about the wireless power receiver coil 34 may further comprise the respective capacitance values of the first capacitor C1 and second capacitor C2, expressed in F (or magnitudes thereof).

This represents a very efficient and yet accurate implementation, where no separate tuning circuitry for the coil 34 will have to be provided in the housing 50 thereof. Instead, the tuning circuitry 86 as well as the data storage 82 will be safely accommodated inside the cable connector 70.

FIG. 8 is a flowchart diagram of a method of testing wireless power transfer from a wireless power transmitter device (such as device 20 as referred to above), having a wireless power transmitter coil (such as coil 24 as referred to above). The method involves the following.

In a first step 110, a testing device is provided which has a wireless power receiver coil hopefully matching the wireless power transmitter coil 24, The provided testing device also has a housing, a cable which extends from the housing at a first end and a cable connector at a second end of the cable, wherein the cable accommodates connection wiring of the wireless power receiver coil. The testing device provided in step 110 may advantageously be the testing device 30 as described above for FIGS. 2-5.

In a second step 120, a host device (such as host device 40 as referred to above) is provided which comprises a processing means (such as processing means 42 as referred to above) and one or a plurality of cable connector inputs (such as sockets 41 or $41_1$-$41_n$ as referred to above).

In a third step 130, the testing device 30 is placed on, at or near the wireless power transmitter device 20.

In a fourth step 140, the cable connector 70 of the cable 60 of the testing device 30 is connected to the single cable connector input 41 (situation in FIG. 6) or one of the available cable connector inputs $41_1$-$41_n$ (situation in FIG. 7) of the host device 40, as the case may be.

In a fifth step 150, the processing means 42 reads data from a data storage (such as data storage 82 as referred to above) of the testing device 30. The data comprises characteristic information 83 about the wireless power receiver coil 34 in the testing device 30.

In a sixth step 160, the processing means 42 controls—based on the characteristic information 83 about the wireless power receiver coil 34—a session for testing wireless power transfer which involves the wireless power transmitter device 20 and the testing device 30.

This may, for instance, involve checking the characteristic information 83 to verify at least one parameter of the wireless power receiver coil 34. The parameter to be verified may advantageously be the type or class of the coil 34. By checking the expected type or class of the coil 34 (based on hard-coded data in the test session program run by the processing means 42, reference data read from a settings file or database, or data having been manually input by the test operator during execution of the test session program) against the type or class of the coil 34 as indicated by the characteristic information 83 read from the data storage 82 of the testing device 30, the processing means 42 may detect if the two does not match. Such a mix-up may occur because of errors in the hard-coded data, in the reference data read from a settings file or database, or in the manual entry made by the test operator.

Alternatively, such a mix-up may occur because the test operator inadvertently connects a different instance of the testing device 30 to the host device 40 than the intended one, or inadvertently connects different instances of the testing device 30 to the incorrect cable connector inputs $41_1$-$41_n$ when the host device 40 has several such inputs like in the embodiment of FIG. 7.

The processing 42 will accordingly refrain from initiating or continuing the test session if the verification fails, and hence only initiate or continue the test session upon successful verification of the type or class of the wireless power receiver coil 34.

In another implementation example of step 160 in FIG. 8, the processing means 42 of the host device 40 retrieves any or all of the additional parameter values of the wireless power receiver coil 34 as stored in the data storage 82, and uses it or them for performing accurate measurements of, for instance, the capability of the wireless power transmitter device 20 to deliver wireless power according to a given rating, criterion or standard.

In yet another implementation example of step 160 in FIG. 8, the processing means 42 of the host device 40 uses any or all of the additional parameter values to perform compliances tests with respect to an applicable wireless power transfer standard, such as Qi.

The equipment and procedures described above will allow testing of wireless power transfer for the benefit of various potential interest groups, such as any or all of the following:
- Developers, manufacturers or suppliers of wireless power transmitter devices,
- Test or compliance entities in the field of wireless power transfer,
- Test or compliance entities in the field of consumer product safety.

The invention has been described above in detail with reference to embodiments thereof. However, as is readily understood by those skilled in the art, other embodiments are equally possible within the scope of the present invention, as defined by the appended claims.

What is claimed is:

1. A testing device for use in testing of wireless power transfer, the testing device comprising:
   a housing;
   a wireless power receiver coil provided in the housing; and
   a cable extending from the housing at a first end and having a cable connector at a second end, the cable accommodating connection wiring of the wireless power receiver coil,
   wherein the cable connector comprises a data storage configured to contain characteristic information about the wireless power receiver coil.

2. The testing device as defined in claim 1, wherein the data storage is an electronic memory.

3. The testing device as defined in claim 1, wherein the characteristic information about the wireless power receiver coil comprises a type or class of the wireless power receiver coil.

4. The testing device as defined in claim 1, wherein the characteristic information about the wireless power receiver coil comprises one or more of the following:
   a unique identifier of the wireless power receiver coil,
   an inductance value of the wireless power receiver coil,
   a first resonance frequency of the wireless power receiver coil, the first resonance frequency being an operation resonance frequency for wireless power transfer,
   a second resonance frequency of the wireless power receiver coil, the second resonance frequency being a detection resonance frequency for wireless power transfer,
   a first equivalent series resistance, ESR, value for the wireless power receiver coil at a first frequency,
   a second equivalent series resistance, ESR, value for the wireless power receiver coil at a second frequency,
   a first Q value for the wireless power receiver coil at the first frequency, and
   a second Q value for the wireless power receiver coil at the second frequency.

5. The testing device as defined in claim 1, the cable connector having a connector housing and a printed circuit board confined within the connector housing, wherein the data storage is mounted on the printed circuit board.

6. The testing device as defined in claim 1, the cable connector comprising a plurality of connector terminals, wherein the data storage is connected to at least one of the connector terminals, and wherein the characteristic information about the wireless power receiver coil is readable by a host device for testing of wireless power transfer.

7. The testing device as defined in claim 6, further comprising a sensor for detecting an operation condition of the testing device, wherein an output of the sensor is connected to at least one of the connector terminals and is readable by the host device for testing of wireless power transfer.

8. The testing device as defined in claim 6, further comprising a status indicator for indicating a status of the testing device, wherein an input of the status indicator is connected to at least one of the connector terminals and is drivable by the host device for testing of wireless power transfer.

9. The testing device as defined in claim 1, wherein the housing has a lower housing part with a bottom side adapted for placement on a surface of a wireless power transmitter device having a wireless power transmitter coil, and an upper housing part.

10. The testing device as defined in claim 9, wherein the testing device is adapted for use with the wireless power transmitter device in the form of a wireless charger.

11. A method of testing wireless power transfer from a wireless power transmitter device having a wireless power transmitter coil, the method involving:
   providing a testing device having a housing, a wireless power receiver coil provided therein, and a cable extending from the housing at a first end and having a cable connector at a second end, the cable accommodating connection wiring of the wireless power receiver coil;
   providing a host device, the host device comprising a processing means and one or a plurality of cable connector inputs;
   placing the testing device on, at or near the wireless power transmitter device;
   connecting the cable connector of the cable of the testing device to one of said one or a plurality of cable connector inputs;
   reading, by the processing means, data from a data storage of the testing device, wherein the data comprises characteristic information about the wireless power receiver coil in the testing device; and controlling, by the processing means and based on the characteristic information about the wireless power receiver coil, a session for testing wireless power transfer which involves the wireless power transmitter device and the testing device.

12. The method as defined in claim 11, wherein controlling a session for testing wireless power transfer comprises:
checking the characteristic information to verify at least one parameter of the wireless power receiver coil; and
initiating the session for testing wireless power transfer only upon successful verification of the parameter of the wireless power receiver coil.

13. The method as defined in claim 11, wherein providing a testing device involves providing the testing device as defined in claim 1.

* * * * *